United States Patent
Hong

(10) Patent No.: US 11,631,752 B2
(45) Date of Patent: Apr. 18, 2023

(54) LOW TEMPERATURE POLYCRYSTALLINE SEMICONDUCTOR DEVICE AND MANUFACTURING METHOD THEREOF

(71) Applicant: Ying Hong, Liaoning (CN)

(72) Inventor: Ying Hong, Liaoning (CN)

(73) Assignee: Ying Hong, Liaoning (CN)

( * ) Notice: Subject to any disclaimer, the term of this patent is extended or adjusted under 35 U.S.C. 154(b) by 0 days.

(21) Appl. No.: 17/584,903

(22) Filed: Jan. 26, 2022

(65) Prior Publication Data

US 2022/0149187 A1  May 12, 2022

Related U.S. Application Data

(60) Division of application No. 17/028,341, filed on Sep. 22, 2020, now Pat. No. 11,271,092, which is a continuation of application No. PCT/KR2019/002511, filed on Mar. 5, 2019.

(30) Foreign Application Priority Data

Mar. 23, 2018 (KR) .......................... 10-2018-0034097
Oct. 29, 2018 (KR) .......................... 10-2018-0130238

(51) Int. Cl.
*H01L 21/00* (2006.01)
*H01L 29/66* (2006.01)
*H01L 21/02* (2006.01)
*H01L 27/12* (2006.01)
*H01L 29/786* (2006.01)
*H01L 29/45* (2006.01)

(52) U.S. Cl.
CPC .. *H01L 29/66757* (2013.01); *H01L 21/02505* (2013.01); *H01L 21/02595* (2013.01); *H01L 21/02672* (2013.01); *H01L 27/1222* (2013.01); *H01L 27/1277* (2013.01); *H01L 29/78675* (2013.01); *H01L 21/02488* (2013.01); *H01L 21/02491* (2013.01); *H01L 21/02532* (2013.01); *H01L 21/02669* (2013.01); *H01L 29/458* (2013.01); *H01L 29/78621* (2013.01)

(58) Field of Classification Search
CPC ......... H01L 29/66757; H01L 21/02505; H01L 21/02595; H01L 21/02672; H01L 27/1222; H01L 27/1277; H01L 29/78675; H01L 21/02488; H01L 21/02491; H01L 21/02532; H01L 21/02699; H01L 29/458; H01L 29/78621
See application file for complete search history.

(56) References Cited

U.S. PATENT DOCUMENTS 6,784,034 B1 *  8/2004  Choi ................. H01L 29/66757
                                                        438/164

\* cited by examiner

*Primary Examiner* — Richard A Booth
(74) *Attorney, Agent, or Firm* — Guntin & Gust, PLC; Miyoung Shin

(57) ABSTRACT

A semiconductor device include a substrate, a buffer layer formed on the substrate, a channel layer formed by an intrinsic polycrystalline silicon layer on the buffer layer, polycrystalline source and drain by non-intrinsic silicon formed on both sides of the polycrystalline silicon layer, a source electrode and a drain electrode formed on the polycrystalline source and the drain, a gate electrode corresponding to the channel layer, and an $NiSi_2$ contact layer located between the source and the source electrode and between the drain and the drain electrode.

2 Claims, 21 Drawing Sheets

LOW TEMPERATURE POLYCRYSTALLINE SEMICONDUCTOR DEVICE AND MANUFACTURING METHOD THEREOF

CROSS-REFERENCE TO RELATED APPLICATIONS AND PRIORITY

The present application is a divisional of U.S. application Ser. No. 17/028,341, filed on Sep. 22, 2020, which is a continuation of PCT/KR2019/002511 filed on Mar. 5, 2019, which claims priority to and the benefit of the filing dates of Korean Patent Application Nos. 10-2018-0034097, filed on Mar. 23, 2018, and 10-2018-0130238, filed on Oct. 29, 2018, in the Korean Intellectual Property Office, the disclosures of which are incorporated herein in their entirety by reference as if they are fully set forth herein.

TECHNICAL FIELD

The present disclosure relates to a polycrystalline MOS device and a manufacturing method thereof, and more particularly, to a CMOS using an LTPS TFT.

BACKGROUND

A low temperature polycrystalline silicon thin film transistor (LTPS TFT) having high mobility and high reliability is appropriate as a pixel switching device of an AM-OLED display that is widely used in a mobile device such as a smartphone.

Excimer laser annealing is mainly used for crystallization of silicon to manufacture the LTPS TFT. Such an LTPS TFT has high mobility and high reliability but may not maintain crystal grain uniformity of a certain level in a large area display in which a large number of TFTs are arranged.

MIC and MILC technologies that have been studied a lot in an LTPS technology cause contamination of Ni elements and a leakage current in a device and thus are not used in actual products. An ELA technology is accompanied by expensive equipment and high process cost, and metal induced crystallization (MIC) and metal induced lateral crystallization methods using a metal catalyst are inexpensive in terms of cost but make quality of a polysilicon thin film low.

SUMMARY

According to one or more embodiments of the present disclosure, a semiconductor device manufactured by a method of manufacturing a semiconductor device is provided. The method includes steps of (i) forming a buffer layer of an insulating material on a substrate, (ii) forming a seed layer of catalyst material containing Ni on the buffer layer, (iii) forming, on the buffer layer, an amorphous intrinsic silicon layer for forming a channel, (iv) forming, on the amorphous intrinsic silicon layer, a non-intrinsic silicon layer for forming a source and/or drain, (v) forming a metal layer on the non-intrinsic silicon layer, and (vi) performing metal induced crystallization (MIC) process producing $NiSi_2$ by catalytic reaction of Ni and Si for crystallization of the amorphous intrinsic silicon layer and the amorphous non-intrinsic silicon layer, and activation of the amorphous non-intrinsic silicon layer to form a conductive area, and forming a contact layer by the $NiSi_2$ being reached between the conductive area and the metal layer while the crystallization is progressed. The semiconductor device includes a substrate, a buffer layer formed on the substrate, a channel layer formed by an intrinsic polycrystalline silicon layer on the buffer layer, polycrystalline source and drain by non-intrinsic silicon formed on both sides of the polycrystalline silicon layer, a source electrode and a drain electrode formed on the polycrystalline source and the drain, a gate electrode corresponding to the channel layer, and an $NiSi_2$ contact layer located between the source and the source electrode and between the drain and the drain electrode.

In at least one variant, the non-intrinsic polycrystalline source and drain include a first non-intrinsic silicon layer contacting both sides of the channel layer, and a second non-intrinsic silicon layer provided on the first non-intrinsic silicon layer. The first non-intrinsic silicon layer further extends toward the gate than the second non-intrinsic silicon layer to form a lightly doped drain (LDD).

In another variant, a PMOS area and an NMOS area are divided on the substrate. A p-type TFT includes source and drain by a p-type non-intrinsic silicon layer is formed in the PMOS area, and an n-type TFT including source and drain by an n-type non-intrinsic silicon layer is formed in the NMOS area.

In another variant, a PMOS area and an NMOS area are divided on the substrate, and a p-type TFT including source and drain by a p-type non-intrinsic silicon layer is formed in the PMOS area, and an n-type TFT including source and drain by an n-type non-intrinsic silicon layer is formed in the NMOS area.

According to one or more embodiments of the present disclosure, a method of manufacturing a semiconductor device includes steps of (i) forming a buffer layer of an insulating material on a substrate, (ii) forming a seed layer of catalyst material containing Ni on the buffer layer, (iii) forming, on the buffer layer, an amorphous intrinsic silicon layer for forming a channel, (iv) forming, on the amorphous intrinsic silicon layer, a non-intrinsic silicon layer for forming a source and/or drain, (v) forming a metal layer on the non-intrinsic silicon layer, and (vi) performing metal induced crystallization (MIC) process for crystallization of the amorphous intrinsic silicon layer and the amorphous non-intrinsic silicon layer, and activation of the amorphous non-intrinsic silicon layer to form a conductive area.

In at least one variant, the manufacturing method further includes forming a catalytic reaction control layer between the seed layer formation operation and the silicon layer formation operation.

In another variant, the seed layer is formed of at least one selected from the group consisting of NiCxOy, NiNxOy, NiCxNyOz, NiCxOy:H, NiNxOy:H, NiCxNyOz:H, NixSiy, and NixGey.

In another variant, the non-intrinsic silicon layer is formed so that a first non-intrinsic silicon layer, in contact with an amorphous silicon layer for forming a semiconductor channel, has a lower doping concentration than a second non-intrinsic silicon layer formed on the first non-intrinsic silicon layer.

In another variant, after the MIC process, a patterning operation of forming a source electrode and a drain electrode corresponding to the intrinsic silicon layer by patterning the metal layer and the non-intrinsic silicon layer.

In another variant, the patterning operation further includes steps of (i) exposing the first non-intrinsic silicon layer in a channel area between the source electrode and the drain electrode by patterning the metal layer and the second non-intrinsic silicon layer, (ii) forming an insulating spacer on inner sides of the source electrode and the second non-intrinsic silicon layer thereunder and on inner sides of the drain electrode and the second non-intrinsic silicon layer thereunder, wherein a lower end of the spacer covers the first non-intrinsic silicon layer by a preset width, and (iii) etching a portion of the first non-intrinsic silicon layer that is not covered with the spacer.

In another variant, a PMOS area and an NMOS area are arranged in the non-intrinsic silicon layer. The silicon layer formation operation further includes forming a p-type non-intrinsic silicon layer and a metal layer thereon in the PMOS area and forming an n-type non-intrinsic silicon layer and a metal layer thereon in the NMOS area.

In another variant, a PMOS area and an NMOS area are arranged in the non-intrinsic silicon layer. The silicon layer formation operation further includes forming a p-type non-intrinsic silicon layer and a metal layer thereon in the PMOS area and forming an n-type non-intrinsic silicon layer and a metal layer thereon in the NMOS area.

In another variant, a PMOS area and an NMOS area are divided on the non-intrinsic silicon layer. The silicon layer formation operation further includes forming a p-type non-intrinsic silicon layer and a metal layer thereon in the PMOS area and forming an n-type non-intrinsic silicon layer and a metal layer thereon in the NMOS area.

In another variant, a PMOS area and an NMOS area are divided on the non-intrinsic silicon layer. The silicon layer formation operation further includes forming a p-type non-intrinsic silicon layer and a metal layer thereon in the PMOS area and forming an n-type non-intrinsic silicon layer and a metal layer thereon in the NMOS area.

In another variant, a PMOS area and an NMOS area are divided on the non-intrinsic silicon layer. The silicon layer formation operation further includes forming a p-type non-intrinsic silicon layer and a metal layer thereon in the PMOS area and forming an n-type non-intrinsic silicon layer and a metal layer thereon in the NMOS area.

In another variant, a PMOS area and an NMOS area are divided on the non-intrinsic silicon layer. The silicon layer formation operation further includes forming a p-type non-intrinsic silicon layer and a metal layer thereon in the PMOS area and forming an n-type non-intrinsic silicon layer and a metal layer thereon in the NMOS area.

Provided are a semiconductor device capable of forming a high-quality polycrystalline silicon thin film at a low process cost and a method of manufacturing the same.

Provided are also an LTPS semiconductor device which may have a large area by effectively forming an LTPS and a method of manufacturing the same.

In a method of manufacturing an LTPS semiconductor device according to an aspect of the present disclosure, an LTPS is formed by using, as a seed, a thin film made of at least one selected from the group consisting of NiCxOy, NiNxOy, NiCxNyOz, NiCxOy:H, NiNxOy:H, NiCxNyOz:H, NixSiy, and NixGey.

According to an aspect of the present disclosure, a method of manufacturing a semiconductor device, includes steps of: (i) forming a buffer layer of an insulating material on a substrate; (ii) a see layer formation operation of forming, on the buffer layer, a seed layer of at least one selected from the group consisting of NiCxOy, NiNxOy, NiCxNyOz, NiCxOy:H, NiNxOy:H, NiCxNyOz:H, NixSiy, and NixGey; (iii) a silicon layer formation operation of forming an amorphous silicon layer on the seed layer; and (iv) a crystallization operation of crystallizing the amorphous silicon layer by a catalytic action of Ni by thermally treating the amorphous silicon layer.

The method may further include forming a catalytic reaction control layer between the seed layer formation operation and the silicon layer formation operation.

The silicon layer formation operation may include steps of: (i) forming, on the buffer layer, an amorphous intrinsic silicon layer for forming a channel; (ii) forming, on the amorphous intrinsic silicon layer, a non-intrinsic silicon layer for forming a source/drain; and (iii) forming a metal layer on the non-intrinsic silicon layer.

The non-intrinsic silicon layer may be formed so that a first non-intrinsic silicon layer, in contact with an amorphous silicon layer for forming a semiconductor channel, has a lower doping concentration than a second non-intrinsic silicon layer.

The method may further include, after the crystallization operation, a pattering operation of forming a source electrode and a drain electrode corresponding to the intrinsic silicon layer by patterning the metal layer and the non-intrinsic silicon layer.

The patterning operation may include steps of: (i) exposing the first non-intrinsic silicon layer in a channel area between the source electrode and the drain electrode by patterning the metal layer and the second non-intrinsic silicon layer; (ii) a spacer formation operation of forming an insulating spacer on inner sides of the source electrode and the second non-intrinsic silicon layer thereunder and on inner sides of the drain electrode and the second non-intrinsic silicon layer thereunder, wherein a lower end of the spacer covers the first non-intrinsic silicon layer by a preset width; and (iii) etching a portion of the first non-intrinsic silicon layer that is not covered with the spacer.

A PMOS area and an NMOS area may be divided on the non-intrinsic silicon layer, and the silicon layer formation operation may include: forming a p-type non-intrinsic silicon layer and a metal layer thereon in the PMOS area and forming an n-type non-intrinsic silicon layer and a metal layer thereon in the NMOS area.

According to another aspect of the present disclosure, a semiconductor device may include: a substrate; a buffer layer formed on the substrate; a channel layer formed by an intrinsic polycrystalline silicon layer on the buffer layer; polycrystalline source and drain by non-intrinsic silicon formed on both sides of the polycrystalline silicon layer; a source electrode and a drain electrode formed on the polycrystalline source and the drain; a gate electrode corresponding to the channel layer; and an $NiSi_2$ contact layer located between the source and the source electrode and between the drain and the drain electrode.

The non-intrinsic polycrystalline source and drain may include: a first non-intrinsic silicon layer contacting both sides of the channel layer; and a second non-intrinsic silicon layer provided on the first non-intrinsic silicon layer, where the first non-intrinsic silicon layer may further extend toward the gate than the second non-intrinsic silicon layer to form a lightly doped drain (LDD).

A PMOS area and an NMOS area may be divided on the substrate, a p-type TFT including source and drain by a p-type non-intrinsic silicon layer may be formed in the PMOS area, and an n-type TFT including source and drain by an n-type non-intrinsic silicon layer may be formed in the NMOS area.

According to an example embodiment, a high-quality primarily oriented LTPS may be obtained, and contamination of Ni may be negligibly lowered. When crystallization of an a-Si thin film is induced by using an amorphous thin film seed layer made of at least one selected from the group consisting of NiCxOy, NiNxOy, NiCxNyOz, NiCxOy:H, NiNxOy:H, NiCxNyOz:H, NixSiy, and NixGey, Ni is precipitated to a thin film surface and thus does not remain in a TFT channel. Crystallinity of LTPS is greater than or equal 98%, a surface RMS is smaller, particle uniformity is high, a large area may be expanded, manufacturing cost is low, and productivity is high. Also, a method according to an example embodiment may reduce a photolithographic process by at least two stages, compared to an existing method of manufacturing a LTPS semiconductor device. In addition, activation of source and drain is performed simultaneously when a silicon channel is crystallized without ion implantation for an existing source-drain doping process, and in particular, may serve as a mass production process for a-Si TFTs, thereby enabling manufacturing facilities to be shared.

DETAILED DESCRIPTION

Figure 1A:
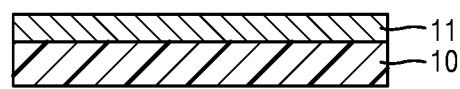
FIG. 1A illustrates an operation for forming a buffer layer on a substrate, according to the present disclosure.

Hereinafter, example embodiments of the present disclosure will be described in detail with reference to the accompanying drawings. However, embodiments of the present disclosure may be modified into various forms, and the scope of the present disclosure should not be construed as being limited by the embodiments described below. The embodiments of the present disclosure may be interpreted as being provided to further completely explain the spirit of the present disclosure to one of ordinary skill in the art. Like reference numerals in the drawings denote like elements. Various elements and areas in the drawings are schematically drawn. Therefore, the spirit of the present disclosure is not limited by the relative size or spacing drawn in the accompanying drawings.

Although the terms first, second etc. may be used herein to describe various elements, these elements should not be limited by these terms. These terms are only used to distinguish one element from another element. For example, a first element may be termed a second element and conversely, the second element may be termed the first element without departing from the scope of the present disclosure.

The terminology used herein is for the purpose of describing particular embodiments only and is not intended to be limiting of example embodiments. As used herein, the singular forms are intended to include the plural forms as well, unless the context clearly indicates otherwise. It will be further understood that the terms "comprises" and/or "have" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two processes described in succession may be performed substantially simultaneously or may be performed in an order opposite to the described order.

As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or" includes any and all combinations of one or more of the associated listed items. The term "substrate" as used herein may mean a substrate itself or a stacked structure including a substrate and a predetermined layer or film formed on the surface thereof. As used herein, "the surface of the substrate" may mean an exposed surface of the substrate itself, or an outer surface of a predetermined layer or film formed on the substrate. What is described as "above" or "on" may include not only those directly on in contact but also non-contact above.

Hereinafter, a method of manufacturing a MOS FET and a complementary metal-oxide semiconductor (CMOS) applying the same according to an example embodiment will be described in detail with reference to the accompanying drawings. In the following description, silicon is referred to as a channel material of a transistor, but according to another example embodiment, other semiconductor materials such as germanium in addition to silicon may be applied as a substitute material.

FIG. 1 schematically shows main processes of processes of manufacturing a metal oxide silicon field effect transistor (MOS FET), according to the present disclosure.

As shown in FIG. 1A, a buffer layer 11 is formed of an insulating material on a substrate 10. An electronic device structure formed in a preceding process may be present underneath the buffer layer 11. The substrate 10 may be a glass substrate or a plastic substrate. The buffer layer 11 may be formed of an insulating material used for manufacturing a semiconductor device, for example, may be formed of one of $SiO_2$, SiNx, SiONx or AlOx.

Figure 1B:
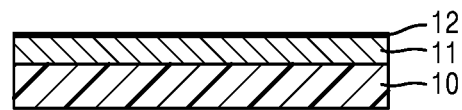
FIG. 1B illustrates an operation for forming an amorphous seed layer on the buffer layer, according to the present disclosure.

As shown in FIG. 1B, an amorphous seed layer 12 is formed to a thickness of several nanometers on the buffer layer 11. An atomic layer deposition (ALD) method may be applied to form the seed layer 12, and a constituent material of the seed layer 12 is one of NiCxOy, NiNxOy, and NiCxNyOz or one of NiCxOy:H, NiNxOy:H, NiCxNyOz:H including hydrogen (H). In addition to the above materials, the material of the seed layer 12 may be NixSiy or NixGey.

Figure 1C:
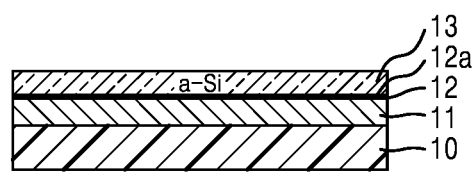
FIG. 1C illustrates an operation for forming an intrinsic silicon layer on the seed layer, according to the present disclosure.

As shown in FIG. 1C, an intrinsic silicon layer 13 is formed by depositing intrinsic a-Si on the seed layer 12. Here, a thickness of the intrinsic silicon layer 13 may be adjusted within a range of about 50 nm to about 150 nm. As a selective element, between the seed layer 12 and the silicon layer 13, a catalytic reaction control layer 12a may be formed to suppress or control violent reaction between an Ni catalyst material and silicon due to direct contact between the seed layer 12 and the silicon layer 13. Before the silicon layer 13 is formed, the catalytic reaction control layer 12a may be formed to a thickness of several angstroms to several nanometers through which the Ni catalyst material may permeate. The maximum thickness of the catalytic reaction control layer 12a is limited to the thickness through which the Ni catalyst material may pass to the silicon layer 13 thereon. The catalytic reaction control layer 12a may be formed of a normal insulating material such as $SiO_2$, SiNx, SiONx or AlOx.

Figure 1D:
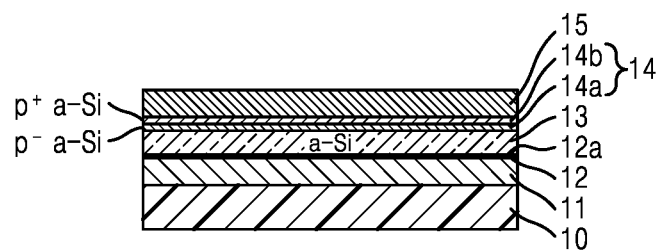
FIG. 1D illustrates an operation for forming a non-intrinsic silicon layer and a metal layer on the intrinsic silicon layer, according to the present disclosure.

As shown in FIG. 1D, a doped or non-intrinsic silicon layer 14 doped with a p-type or n-type dopant and a metal layer 15 are sequentially stacked on the intrinsic silicon layer 13. Among the dopants, the p-type dopant includes at least one selected from the group consisting of B, Al, Ga, and In, and the n-type dopant includes at least one selected from the group consisting of P, Sb, and As.

Here, the non-intrinsic silicon layer 14 may be formed as a single layer doped with a p-type or n-type dopant at a preset concentration and, according to the present embodiment, may include first and second non-intrinsic silicon layers 14a and 14b having different doping concentrations. For example, the doping concentration of the first non-intrinsic silicon layer 14a in contact with the intrinsic silicon layer 13 is lower than that of the second non-intrinsic silicon layer 14b thereon, and the first and second non-intrinsic silicon layers 14a and 14b are crystallized into polycrystalline silicon in a subsequent heat treatment process. The metal layer 15 may have a single layer or multilayer structure. According to the present embodiment, the metal layer 15 may have a sandwich structure having a stack structure of TiN/Al/TiN.

After the metal layer 15 is completed as described above, an a-Si island to be used as a channel of a TFT is formed by patterning an intrinsic silicon layer formed in a transistor area, in particular, formed on the entire surface of the substrate 10.

Figure 1E:
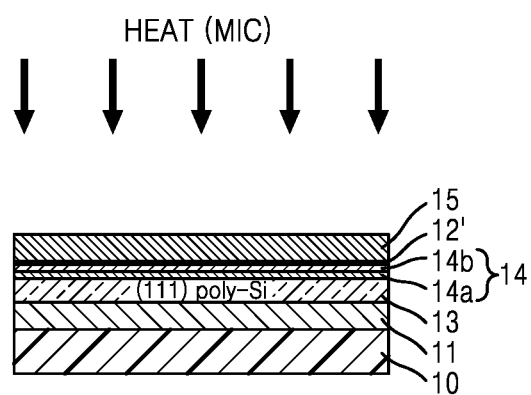
FIG. 1E illustrates an operation for performing metal induced crystallization of the silicon layers, according to the present disclosure.

As shown in FIG. 1E, metal induced crystallization (MIC) is performed through heat treatment. According to this heat treatment, a-Si of the amorphous silicon layer 13 on the seed layer 12 is crystallized, and thus, the silicon layer 13 formed of poly-Si oriented in (111) direction is obtained. In this process, Ni and Si of the seed layer 12 react with each other to produce $NiSi_2$, $NiSi_2$ reaches the uppermost non-intrinsic silicon layer 14 after passing through the silicon layer 13 to form a contact layer 12' between the non-intrinsic silicon layer 14 and the metal layer 15, and nickel is precipitated to the outside of the non-intrinsic silicon layer 14 after crystallization is completed. Also, in the MIC process, the non-intrinsic silicon layer 13 is crystallized together, and a dopant of the non-intrinsic silicon layer 14 is activated to form a conductive area.

According to the example embodiment described above, source/drain doping, which is performed by existing ion implantation, may be achieved through deposition of the non-intrinsic silicon layer 14 and the MIC process without a separate ion implantation process. At the current stage, the source and drain are not yet isolated, and a source S and a drain D are obtained through a subsequent patterning process of the non-intrinsic silicon layer 14.

Figure 1F:
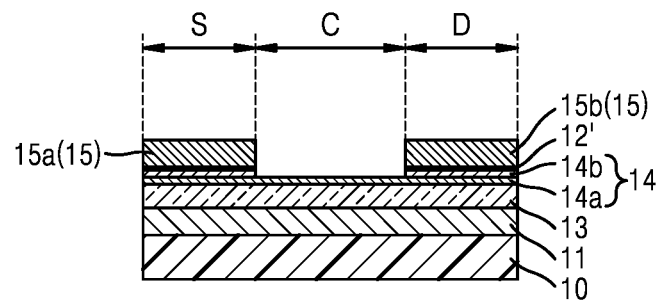
FIG. 1F illustrates an operation for patterning the metal layer and the non intrinsic silicon layer, according to the present disclosure.

As shown in FIG. 1F, the metal layer 15 and the second non-intrinsic silicon layer 14b underneath the same are patterned by using a photolithographic method, thereby forming, on both sides of a silicon semiconductor channel area C, the source S and the drain D, and a source electrode 15a and a drain electrode 15b corresponding thereto. According to this patterning, a portion of the first non-intrinsic silicon layer 14a covering the intrinsic silicon layer 13 is exposed on the surface of the silicon semiconductor channel area C.

Here, an extended area of the first non-intrinsic silicon layer 14a that is not covered with the second non-intrinsic silicon layer 14b correspond to a lightly doped drain (LDD) having lower conductivity than the second non-intrinsic silicon layer 14b.

Figure 1G:
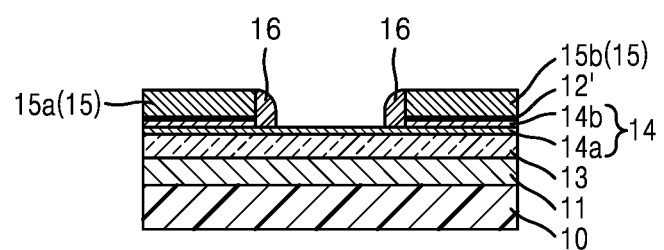
FIG. 1G illustrates an operation for forming a spacer for covering crystallization of the strips, according to the present disclosure.

As shown in FIG. 1G, a spacer 16 for covering an upper portion of the first non-intrinsic silicon layer 14a is formed on facing sides of the source electrode 15a and the drain electrode 15 formed at a preset height above both sides of the intrinsic silicon layer 13. The spacer 16 is formed not only on sides of the source electrode 15a and the drain electrode 15b but also on a side of the second non-intrinsic silicon layer 14b thereunder, and a lower end thereof covers the surface of the first non-intrinsic silicon layer 14a. The spacer 16 may be formed of an insulating material such as $SiO_2$ or SiNx, and the spacer 16 covering the LDD area may be obtained through entire surface deposition and etch back processes of $SiO_2$ or SiNx.

Figure 1H:
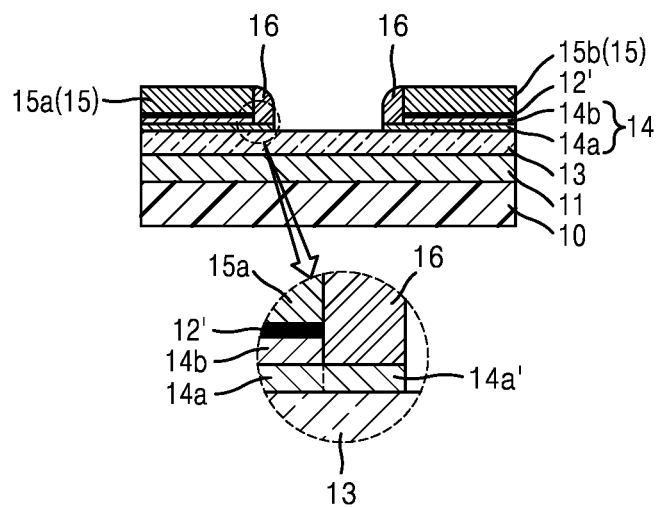
FIG. 1H illustrates an operation for partial removing a part of the non-intrinsic silicon layer, according to the present disclosure.

As shown in FIG. 1H, a portion of the non-intrinsic silicon layer that is not covered with the spacer 16 between the source electrode 15a and the drain electrode 15b is removed. Through this etch back process, an extended portion 14a' of the first non-intrinsic silicon layer 14a corresponding to the LDD area is located underneath the spacer 16.

Figure 1I:
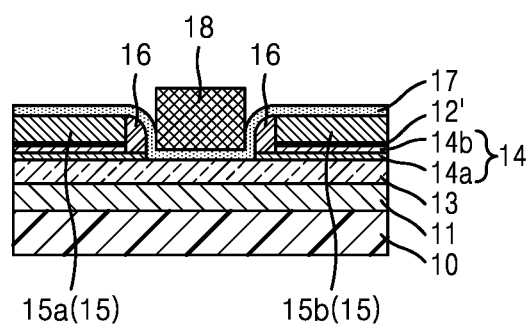
FIG. 1I illustrates an operation for forming a gate insulating layer, according to the present disclosure.

As shown in FIG. 1I, a gate insulating layer 17 is formed on the entire surface of the source electrode 15a and the drain electrode 15b, and the intrinsic silicon layer 13 exposed therebetween, and a gate electrode 18 is formed in a channel area between the source electrode 15a and the drain electrode 15b.

Here, the gate insulating layer 17 may be formed of one of SiNx, SiO$_2$, AlOx, or HfOx. The gate electrode 18 may be obtained by entire surface deposition and patterning of MoW.

Figure 1J:
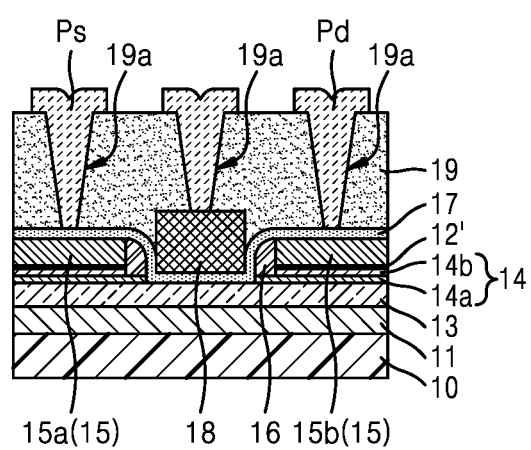
FIG. 1J illustrate an operation for forming an interlayer dielectric layer having a contact hole, according to the present disclosure.

As shown in FIG. 1J, an interlayer dielectric (ILD) layer 19 having a contact hole 19a is formed on the gate electrode 18, and electrode pads Ps, Pg, and Pd that are electrically connected to the source electrode 15a, the drain electrode 15b, and the gate electrode 18, respectively, through the contact hole 19a are formed on the ILD layer 19.

In the above-described process, merely a major part has been described without describing a method of manufacturing a complete MOS to aid in understanding of the example embodiment.

Hereinafter, an embodiment of a method of manufacturing a CMOS for a display will be described with reference to FIGS. 2A through 2K.

Figure 2A:
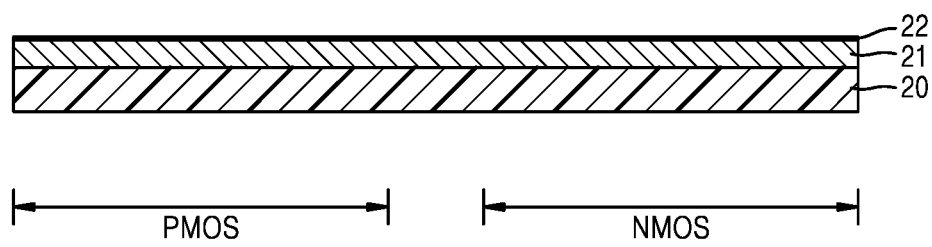
FIG. 2A illustrates an operation for forming a buffer layer and an amorphous seed layer on a substrate, according to the present disclosure.

As shown in FIG. 2A, a buffer layer 21 and an amorphous seed layer 22 are sequentially formed on a substrate 20 in which a PMOS area and an NMOS area are defined (divided). The buffer layer 21 may be formed of one of SiO$_2$, SiNx, SiONx, or AlOx.

The seed layer 22 is formed to a thickness of several nanometers. Thermal atomic layer deposition (ALD), plasma enhanced thermal atomic layer deposition (PE-ALD), pulsed plasma enhanced chemical vapor deposition (PECVD), or the like may be used to form the seed layer 22. A constituent material of the seed layer 22 is at least one selected from the group consisting of NiCxOy, NiNxOy, NiCxNyOz, NiCxOy:H, NiNxOy:H, NiCxNyOz:H, NixSiy, and NixGey. The material of the seed layer 22 material may include crystallization of silicon at a lower temperature than existing NiOx, thereby obtaining high-quality polycrystalline silicon.

Figure 2B:
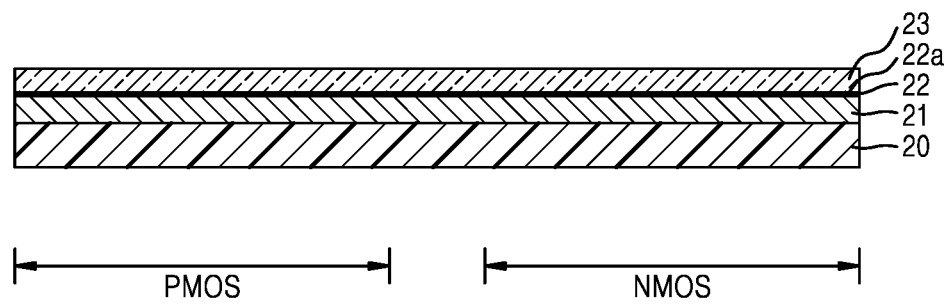
FIG. 2B illustrates an operation for forming an intrinsic silicon layer on the seed layer, according to the present disclosure.
Figure 2C:
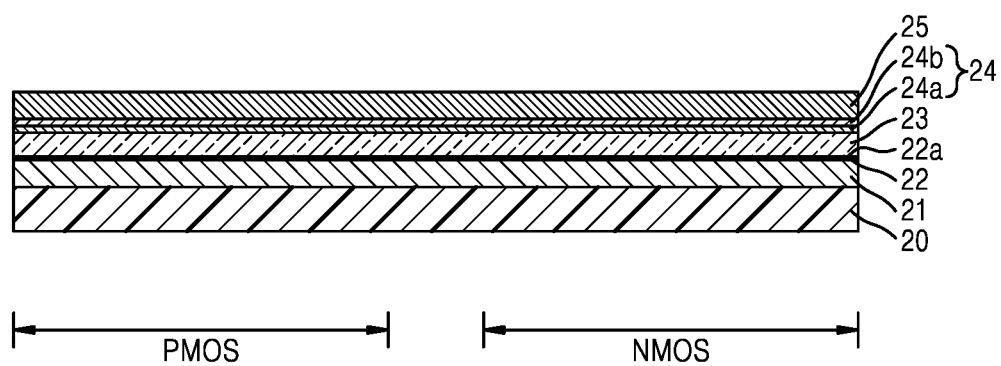
FIG. 2C illustrates an operation for forming a p-type non-intrinsic silicon layer and a first metal layer on the intrinsic silicon layer, according to the present disclosure.

As shown in FIG. 2B, an intrinsic silicon layer 23 to be used as a channel of a transistor is formed of amorphous silicon on the seed layer 22. Here, a thickness of the intrinsic silicon layer 23 is about 50 nm to about 150 nm. A catalytic reaction control layer 22a as described above may be selectively formed. In other words, the catalytic reaction control layer 22a is a selective element and may be formed before the intrinsic silicon layer 23 is formed. The catalytic reaction control layer 22a may be formed of a normal insulating material such as SiNx, SiONx, or AlOx As shown in FIG. 2C, a p-type non-intrinsic silicon layer 24 including a p-type dopant and a first metal layer 25 are sequentially formed on the intrinsic silicon layer 23. Here, the p-type non-intrinsic silicon layer 24 may be formed of a plurality of layers having different doping concentrations.

In the present embodiment, the p-type non-intrinsic silicon layer 24 includes a first non-intrinsic silicon layer 24a and a second non-intrinsic silicon layer 24b thereon. A doping concentration of the second non-intrinsic silicon layer 24a is relatively higher than that of the first non-intrinsic silicon layer 24a. The first metal layer 25 may have a multilayer structure in which the same or different types of layers are stacked. According to the present embodiment, the first metal layer 25 may have a sandwich structure having a stack structure of TiN/Al/TiN.

Figure 2D:
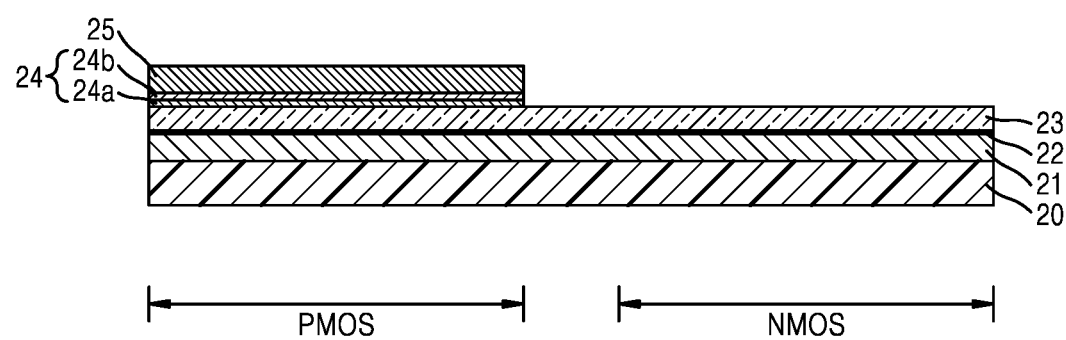
FIG. 2D illustrates an operation for patterning the p-type non-intrinsic silicon layer on the seed layer, according to the present disclosure

As shown in FIG. 2D, the p-type non-intrinsic silicon layer 24 is patterned from the metal layer 25. Here, merely the PMOS area remains, and the p-type non-intrinsic silicon layer 24 is removed by etching from the first metal layer 25 in a remaining area. For this, for a detailed example, the PMOS area to be protected is covered with a mask layer such as photoresist and then etched, thereby removing portions of the p-type non-intrinsic silicon layer 24 and the first metal layer 25, including the NMOS area, outside the PMOS area.

After selective etching as described above, cleaning is performed, and then a stack structure, including an n-type non-intrinsic silicon layer 26 and a second metal layer 27 thereon in the NMOS area, is formed on the intrinsic silicon layer 23 in the NMOS area.

Figure 2E:
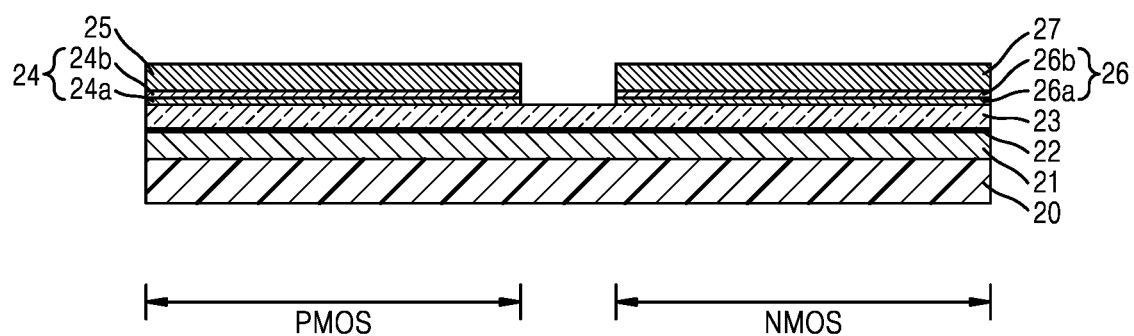
FIG. 2E illustrates an operation for forming a n-type silicon layer and a second metal layer, according to the present disclosure.

As shown in FIG. 2E, the n-type non-intrinsic silicon layer 26 and the second metal layer 27 are formed in the NMOS area other than the PMOS area. This process includes a deposition process of a non-intrinsic silicon material and metal on the entire surface, and a process of removing n-type non-intrinsic silicon and metal thereon in a portion excluding the NMOS area.

Figure 2F:
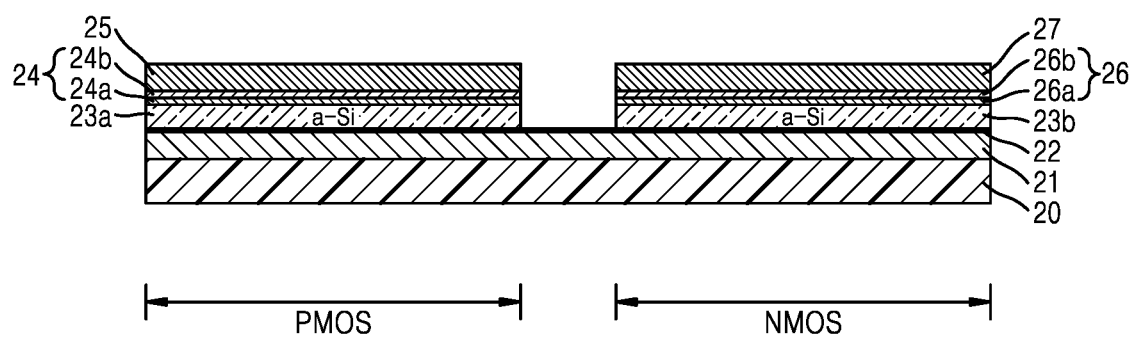
FIG. 2F illustrates an operation for forming silicon islands on the seed layer, according to the present disclosure

As shown in FIG. 2F, a stack structure for manufacturing a p-type TFT and an n-type TFT, respectively, in the PMOS area and the NMOS area obtained through the processes described above is patterned, thereby forming silicon islands 23a and 23b to be used as channels of the p-type TFT and the n-type TFT, from the amorphous non-intrinsic silicon layer 23.

Figure 2G:
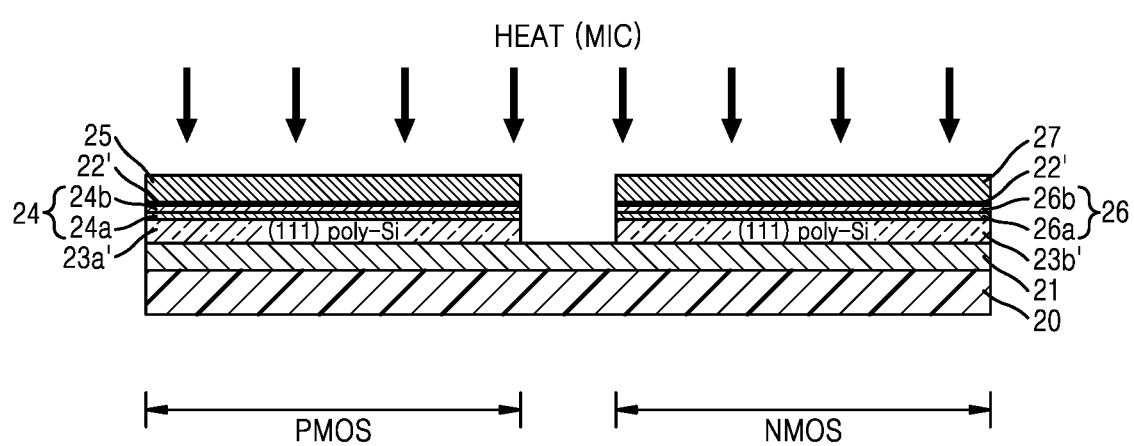
FIG. 2G illustrates an operation for inducing crystallization of the silicon islands, according to the present disclosure

As shown in FIG. 2G, MIC is performed by heat treatment to form polycrystalline islands 23a' and 24b', which are (111) oriented, from the silicon islands 23a and 23b. In this process, not only intrinsic silicon but also non-intrinsic silicon is crystallized. According to this crystallization, Ni and Si of a catalytic layer present under the intrinsic silicon layer 23 reach with each other to form NiSi$_2$, and NiSi$_2$ rises to the top of a silicon layer and contacts the first and second metal layers 25 and 27 to function as a contact layer between silicon and metal.

In the present embodiment, heat treatment may be performed in a normal furnace and may also be performed in a furnace to which an electromagnetic field is applied.

Figure 2H:
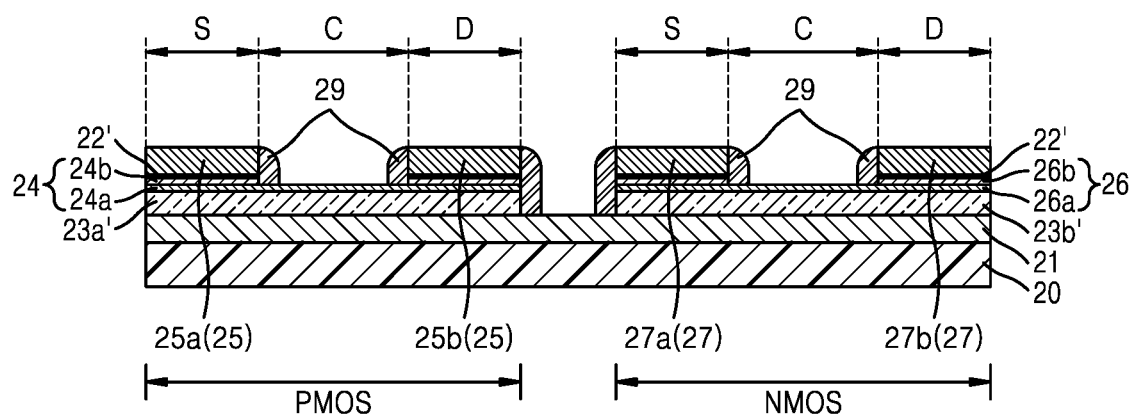
FIG. 2H illustrates an operation for patterning to form source and drain electrodes, according to present disclosure.

As shown in FIG. 2H, the first and second metal layers 25 and 27 are patterned to form source electrodes 25a and 27a and drain electrodes 25b and 27b in the PMOS area and the NMOS area, and, under a channel area C therebetween, first non-intrinsic silicon layers 24a and 26a are exposed.

Above both sides of the intrinsic silicon layer 23, a spacer 29 covering the first non-intrinsic silicon layers 24a and 26a is formed on facing sides of the source electrodes 25a and 27a and the drain electrodes 25b and 27b formed at a preset height in a source area S and a drain area D. The spacer 29 is formed not only on sides of the source electrodes 25a and 27a and the drain electrodes 25b and 27b but also on sides of the second non-intrinsic silicon layers 24b and 26b thereunder, and a lower end thereof covers preset widths of surfaces of the first non-intrinsic silicon layers 24a and 26a providing an LDD area. The spacer 29 may be formed of an insulating material such as SiO2 (or SiNx), and the spacer 29 covering the LDD area may be obtained through entire surface deposition and etch back processes of SiO2 (or SiNx).

Figure 2I:
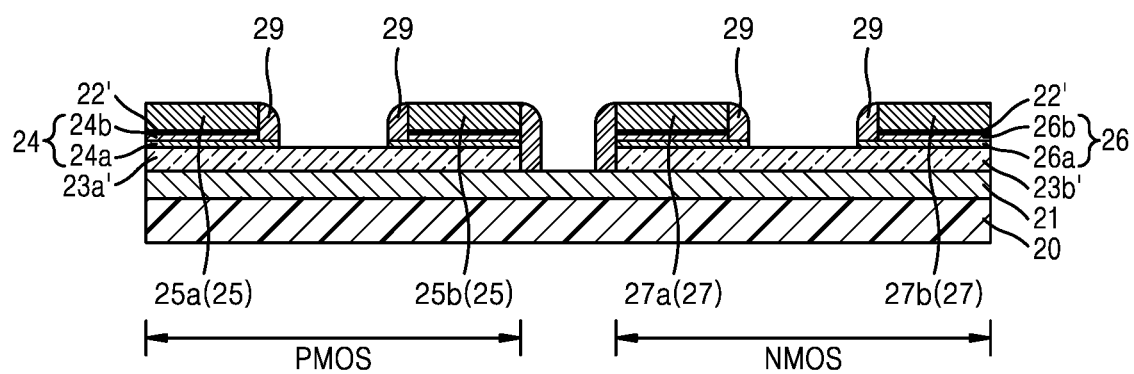
FIG. 2I illustrates an operation for removing a part of the non-intrinsic layer between the source and drain electrode, according to the present disclosure

As shown in FIG. 2I, the first non-intrinsic silicon layers 24a and 26a that are not covered with the spacer 29 are removed to expose surfaces of polycrystalline silicon islands 23a' and 23b' underneath the same. Here, the surfaces of the polycrystalline silicon islands 23a' and 23b' are exposed by a self-align etching method using, as a mask, the source electrodes 25a and 27a, the drain electrodes 25b and 27b, and the spacer 29.

Figure 2J:
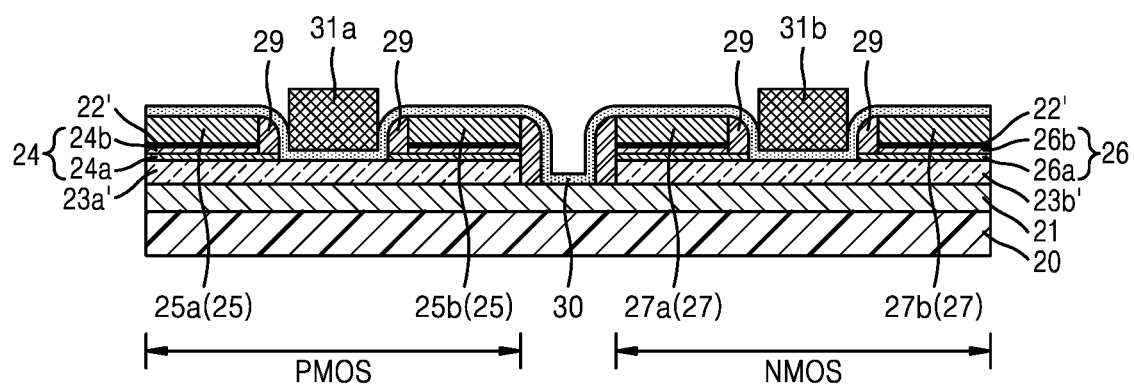
FIG. 2J illustrates an operation for forming a gate electrode, according to the present disclosure

As shown in FIG. 2J, a gate insulating layer 30 is formed over the PMOS area and the NMOS area, and each of gate electrodes 31a, 31b is formed in a channel area of each of the PMOS are and the NMOS area.

Here, the gate insulating layer 30 may be formed of one of SiNx, $SiO_2$, AlOx, or HfOx. The gate electrodes 31a, 31b may be obtained through entire surface deposition and patterning of MoW.

Figure 2K:
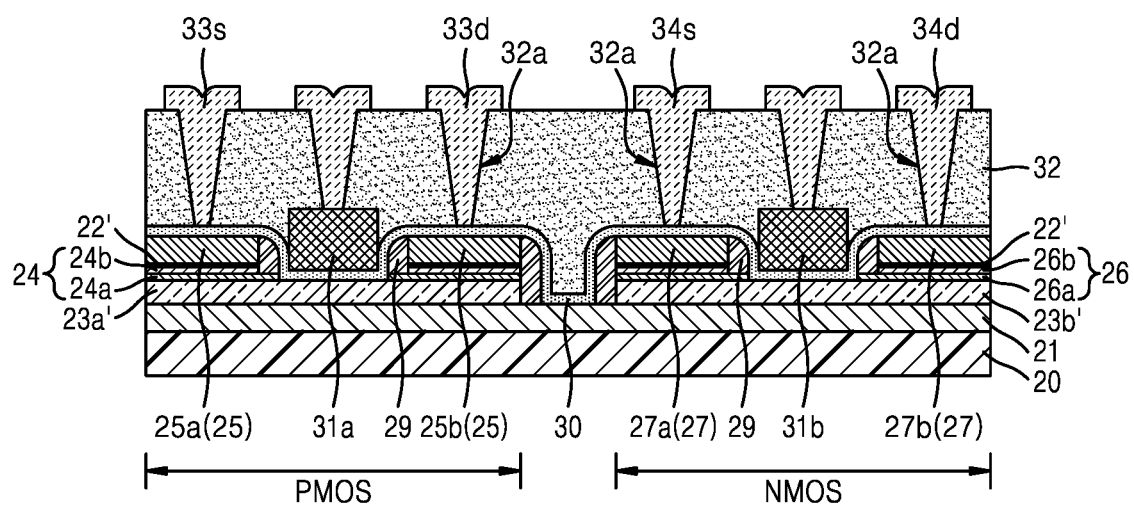
FIG. 2K illustrates operation for forming an interlayer dielectric layer having contact holes and metal pads thereon, according to the present disclosure.

As shown in FIG. 2K, an ILD layer 32 having a contact hole 32a connected to the source electrodes 25a and 27a, the drain electrodes 25b and 27b, and gate electrodes 31a, 31b is formed. Here, metal pads 33s, 33g, 33d, 34s, 34g, and 34d are formed to complete a CMOS having a PMOS TFT and an NMOS TFT. Thereafter, a process of forming additional elements of a device to which these CMOSs are applied may be performed.

In the above process, each of an intrinsic amorphous silicon layer and a non-intrinsic silicon layer including an n-type or p-type dopant may be deposited in an independent cluster chamber.

Materials of source/drain electrodes and a gate electrode as described above are associated with control of a threshold voltage Vth of a device and thus need to appropriately combined. Also, an LDD by a first non-intrinsic silicon layer is associated with control of a leakage current and control of the threshold voltage Vth, and thus, whether or not the LDD is to be formed may be determined by the controls of the leakage current and the threshold voltage Vth. For example, an LDD may not be formed in a PMOS.

A method of manufacturing an LTPS TFT and a CMOS applying the same according to the present disclosure as described above performs crystallization by basically using amorphous Ni-based oxide as a catalyst. As a seed layer formed of Ni-based oxide for this, one of NiCxOy, NiNxOy, and NiCxNyOz in addition NiOx may be applied or one of NiCxOy:H, NiNxOy:H, and NiCxNyOz:H including hydrogen (H) may be applied. Also, the seed layer may be formed of NixSiy or NixGey.

Through this process, an LTPS TFT (111)-oriented on a glass substrate or a plastic substrate may be obtained, and a CMOS may also be formed by using the same.

In addition, when forming a polycrystalline silicon channel, an intrinsic silicon layer for a silicon channel and intrinsic silicon for a source and a drain, i.e., silicon including an n-type dopant or a p-type dopant, is formed. Therefore, without an existing separate ion implantation process, crystallization of intrinsic silicon, and crystallization and activation of source and drain by non-intrinsic silicon are simultaneously achieved in an MIC process.

Also, non-intrinsic silicon forming the source and drain are formed in a multilayer. Here, a dopant concentration of a first intrinsic silicon layer contacting a silicon channel may be lower than a dopant concentration of a second non-intrinsic silicon layer thereon, and the first non-intrinsic silicon layer may extend closer to the center of a channel than the second non-intrinsic silicon layer, thereby implementing an LDD having low conductivity.

A method of manufacturing a semiconductor device according to an example embodiment has been described with reference to the embodiments shown in the drawings to aid in understanding the present disclosure, but this is merely an example. It will be understood by one of ordinary skill in the art that various modifications and other equivalent embodiments are possible therefrom. Therefore, the technical scope of the present disclosure should be defined by the appended claims.

What is claimed is:

1. A semiconductor device manufactured by a method of manufacturing a semiconductor device, the method comprising:
    forming a buffer layer of an insulating material on a substrate;
    forming a seed layer of catalyst material containing Ni on the buffer layer; forming, on the buffer layer, an amorphous intrinsic silicon layer for forming a channel;
    forming, on the amorphous intrinsic silicon layer, a non-intrinsic silicon layer for forming a source and/or drain;
    forming a metal layer on the non-intrinsic silicon layer;
    performing metal induced crystallization (MIC) process producing $NiSi_2$ by catalytic reaction of Ni and Si for crystallization of the amorphous intrinsic silicon layer and the amorphous non-intrinsic silicon layer, and activation of the amorphous non-intrinsic silicon layer to form a conductive area, and forming a contact layer by the NiSb being reached between the conductive area and the metal layer while the crystallization is progressed;
    the semiconductor device comprising:
        a substrate;
        a buffer layer formed on the substrate;
        a channel layer formed by an intrinsic polycrystalline silicon layer on the buffer layer;
        polycrystalline source and drain by non-intrinsic silicon formed on both sides of the polycrystalline silicon layer;
        a source electrode and a drain electrode formed on the polycrystalline source and the drain;
        a gate electrode corresponding to the channel layer; and
        an $NiS_2$ contact layer located between the source and the source electrode and between the drain and the drain electrode;
wherein the non-intrinsic polycrystalline source and drain comprise:
a first non-intrinsic silicon layer contacting both sides of the channel layer; and
a second non-intrinsic silicon layer provided on the first non-intrinsic silicon layer,
wherein:
    the first non-intrinsic silicon layer further extends toward the gate than the second non-intrinsic silicon layer to form a lightly doped drain (LDD).
2. The semiconductor device of claim 1, wherein:
    a PMOS area and an NMOS area are divided on the substrate; and
    a p-type TFT including source and drain by a p-type non-intrinsic silicon layer is formed in the PMOS area, and an n-type TFT including source and drain by an n-type non-intrinsic silicon layer is formed in the NMOS area.

* * * * *